United States Patent
Shu et al.

(10) Patent No.: US 9,621,152 B2
(45) Date of Patent: Apr. 11, 2017

(54) COUPLING INDUCTOR BASED HYBRID MILLIMETER-WAVE SWITCH

(71) Applicant: The Regents of the University of California, Oakland, CA (US)

(72) Inventors: Ran Shu, Davis, CA (US); Adrian J. Tang, Davis, CA (US); Qun Gu, Davis, CA (US); Brian J. Drouin, Davis, CA (US)

(73) Assignees: THE REGENTS OF THE UNIVERSITY OF CALIFORNIA, Oakland, CA (US); CALIFORNIA INSTITUTE OF TECHNOLOGY, Pasadena, CA (US)

(*) Notice: Subject to any disclaimer, the term of this patent is extended or adjusted under 35 U.S.C. 154(b) by 0 days.

(21) Appl. No.: 15/154,813

(22) Filed: May 13, 2016

(65) Prior Publication Data

US 2016/0336934 A1 Nov. 17, 2016

Related U.S. Application Data

(60) Provisional application No. 62/161,822, filed on May 14, 2015.

(51) Int. Cl.
*H03K 17/10* (2006.01)

(52) U.S. Cl.
CPC .................. *H03K 17/102* (2013.01)

(58) Field of Classification Search
CPC ..................................... H03K 17/102
See application file for complete search history.

(56) References Cited

U.S. PATENT DOCUMENTS

| 5,717,356 A * | 2/1998 | Kohama ............ H03K 17/063 327/365 |
| 6,201,455 B1 * | 3/2001 | Kusunoki ............... H01P 1/15 327/308 |
| 2014/0327495 A1 * | 11/2014 | He ........................ H01H 9/54 333/103 |

* cited by examiner

*Primary Examiner* — Hai L Nguyen
(74) *Attorney, Agent, or Firm* — Park, Vaughan, Fleming & Dowler LLP; Laxman Sahasrabuddhe

(57) ABSTRACT

A switch comprising a plurality of inductors and a plurality of shunt transistors is described. Each inductor can be electrically coupled between adjacent shunt transistors to form a distributed switch structure. At least two inductors in the plurality of inductors can be inductively coupled with each other. The plurality of inductors can correspond to portions of a coupling inductor, wherein the coupling inductor can have an irregular octagonal shape.

20 Claims, 5 Drawing Sheets

COUPLING INDUCTOR BASED HYBRID MILLIMETER-WAVE SWITCH

RELATED APPLICATION

This application claims benefit of U.S. Provisional Application Ser. No. 62/161,822, by the same inventors, filed on 14 May 2015, the contents of which are herein incorporated by reference in their entirety for all purposes.

This invention was made with United States Government support under Grant No. 1507890 awarded by NASA/JPL. The United States Government has certain rights in this invention.

BACKGROUND

Technical Field

This disclosure relates to electronic circuits. More specifically, this disclosure relates to a coupling inductor based hybrid millimeter (mm)-wave switch.

Related Art

For mm-wave applications, e.g., passive imaging, short-range communication, and sensing, etc., switches are essential components for transmitting-receiving functions, signal-routing, and modulation. For example, see (1) M. Uzunkol and G. M. Rebeiz, "A Low-Loss 50-70 GHz SPDT Switch in 90 nm CMOS," IEEE J. Solid-State Circuits, vol. 45, no. 10, pp. 2003-2007, October 2010 (hereinafter "Uzunkol"), (2) S.-F. Chao, et al, "A 50 to 94-GHz CMOS SPDT Switch Using Traveling-Wave Concept," IEEE Microw. Wirel. Compon. Lett., vol. 17, no. 2, pp. 130-132, February 2007 (hereinafter "Chao"), and (3) J. He, et al, "Analysis and Design of 60-GHz SPDT Switch in 130-nm CMOS," IEEE Trans. Microw. Theory Tech., vol. 60, no. 10, pp. 3113-3119, October 2012 (hereinafter "He").

Switches can have one or more input ports and one or more output ports. For example, a single-pole single-throw (SPST) switch has a single input port and a single output port, and the switch can be in one of two states: open (the input port is electrically disconnected from the output port) or closed (the input port is electrically connected to the output port). The important specifications of a switch include, inter alia, insertion loss, return loss, isolation, and power handling ability. Insertion loss refers to the loss (e.g., voltage drop, power loss, etc.) that is introduced by the switch between the input port and the output port. Return loss is a measure of the power of the reflected signal, i.e., the power of the signal that is reflected back at the input port. Note that return loss is a component of insertion loss; the higher is the return loss of a switch, the higher is its insertion loss. Isolation refers to the ability of the switch to prevent power leakage from the input port to the output port when the input port is electrically disconnected from the output port. Power handling ability refers to the upper bound of the range of input power values over which the output power of the switch increases linearly with the input power. Power handling ability can be represented by the so-called "input-referred 1-dB compression point," which is defined as the input power that causes a 1 dB drop in the output power with respect to the linear gain due to device saturation. For example, let us assume that, at an input power of x dB, the output power of the switch is expected to be y dB based on the linear gain of the switch. However, suppose the actual output power of the switch is (y−1) dB instead of y dB. Then, x dB is the "input-referred 1-dB compression point" for the switch.

A series-shunt switch architecture is traditionally used for switches that operate in the radio frequency (RF) bands. In contrast, for mm-wave switches, conventional architectures remove the series switch to reduce insertion loss (e.g., see Uzunkol and Chao). However, isolation performance degrades without the series switches. Therefore, what are needed are switches that have low return loss, low insertion loss, high isolation, and high power handling ability over a wide range of mm-wave frequencies.

SUMMARY

Some embodiments described herein feature a coupling inductor based hybrid millimeter (mm)-wave switch. Specifically, a switch circuit is described that, in some implementations, can achieve higher than 35 dB isolation over an ultra-wide frequency range, e.g., from 54 GHz to 84 GHz, a minimum 1.7 dB insertion loss, and less than −10 dB return loss with a 0.012 $mm^2$ chip area by using a 65 nm CMOS manufacturing process. Note that these implementations achieve more than 10 dB enhancement of isolation when compared to conventional approaches for similar insertion losses.

In some embodiments, the switch can comprise a plurality of inductors, and a plurality of shunt transistors. The plurality of inductors can comprise a first inductor having a first terminal and a second terminal, a second inductor having a first terminal and a second terminal, wherein the second terminal of the first inductor is electrically connected with the first terminal of the second inductor. The first inductor can be inductively coupled with the second inductor so that a negative mutual inductance exists between the first inductor and the second inductor.

The plurality of shunt transistors can comprise (1) a first shunt transistor controlled by a control voltage, wherein the first shunt transistor is electrically connected between the first terminal of the first inductor and a first shunt terminal having a shunt voltage (e.g., the shunt voltage can be ground, but generally the shunt voltage can be any voltage to which the input signal is shunted when the switch is in the "open" state); (2) a second shunt transistor controlled by the control voltage, wherein the second shunt transistor is electrically connected between the second terminal of the first inductor and a second shunt terminal having the shunt voltage; and (3) a third shunt transistor controlled by the control voltage, wherein the third shunt transistor is electrically connected between the second terminal of the second inductor and a third shunt terminal having the shunt voltage.

In some embodiments, the first inductor is a portion of a coupling inductor that begins at a first terminal of the coupling inductor and ends at a tap of the coupling inductor, and wherein the second inductor is a portion of the coupling inductor that begins at the tap of the coupling inductor and ends at a second terminal of the coupling inductor. In some embodiments, the coupling inductor can have an irregular octagonal shape.

In some embodiments, the switch can further comprise: (1) an input port to receive an input signal; (2) an output port to output an output signal; (3) a first capacitor electrically connected between the input port and the first terminal of the first inductor; and (4) a second capacitor electrically connected between the output port and the second terminal of the second inductor.

In some embodiments, the switch can further comprise: (1) a first resistor electrically connected between the first terminal of the first inductor and a reverse polarity terminal having a reversed polarity of the control voltage; and (2) a second resistor electrically connected between the second terminal of the second inductor and the reverse polarity terminal having the reversed polarity of the control voltage.

In some embodiments, each shunt transistor has a triple-well structure comprising a P-well bulk, a deep-Nwell, and a P-substrate. In some embodiments, the P-well bulk is biased to ground, and the deep-Nwell is biased to a supply voltage.

A plurality of individual switches can be used to create a switch that has multiple poles and/or multiple throws. Embodiments of switches described in this disclosure can generally be included in any device that handles mm-wave signals. Examples of such devices include, but are not limited to, passive imaging, short-range communication, and sensing devices. Specifically, a device may comprise a first circuit that generates an mm-wave signal, and a second circuit that receives an mm-wave signal (e.g., for further processing). The first circuit can be electrically connected to an input port of the switch and the second circuit can be electrically connected to an output port of the switch. The control voltage can be used to control whether or not the mm-wave signal generated by the first circuit is allowed to propagate to the second circuit.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

First, an analysis of switch insertion loss and isolation is presented, followed by an optimization of those parameters, and an analysis of the tradeoffs. Next, a switch circuit is presented for optimum performance that is verified by a hybrid mm-wave circuit implementation in 65 nm CMOS technology. Because the series transistor in the traditional RF switch design is removed in mm-wave switches, the design of a shunt-transistor based switch faces a direct tradeoff between insertion loss and isolation. Specifically, a shunt transistor can be modelled as a channel resistor $R_{on}$ at on-state and a paralleled combination of a resistor $R_{off}$ and capacitor $C_{off}$ at off-state. The on-state resistance $R_{on}$ determines the isolation performance: a smaller $R_{on}$ leads to a higher isolation. A smaller $R_{on}$ can be achieved by using a larger device size. On the other hand, a larger device size increases $C_{off}$, resulting in higher insertion loss and a narrower bandwidth.

A few approaches have tried to improve switch performance by overcoming the inherent tradeoff. For example, a transmission-line (TL) stub can be added parallel with the shunt switch to compensate $C_{off}$, effectively broadening the operating bandwidth (see e.g., Uzunkol). A π-type network based mm-wave SPST switch can be used to improve the isolation, e.g., see A. Tomkins, et al, "A Passive W-Band Imaging Receiver in 65-nm Bulk CMOS," IEEE J. Solid-State Circuits, vol. 45, no. 10, pp. 1981-1991, October 2010 (hereinafter "Tomkins"). To further improve isolation, more stages may be added, which leads to a distributed structure. For example, see Chao and also K.-Y. Lin, et al, "Millimeter-wave MMIC passive HEMT switches using traveling-wave concept," IEEE Trans. Microw. Theory Tech., pp. 1798-1808, August 2004 (hereinafter "Lin").

Figure 1:
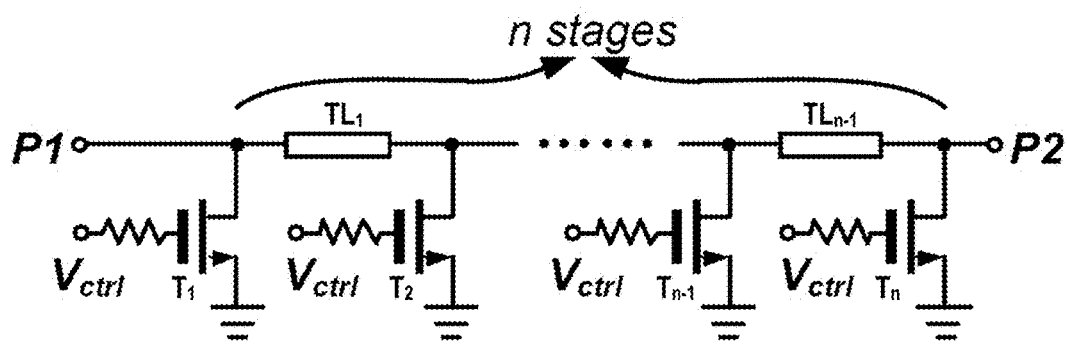
FIG. 1 illustrates a distributed transmission line (TL)-based architecture for a switch.

FIG. 1 illustrates a distributed TL-based architecture for a switch. Port "P1" can be the input port and port "P2" can be the output port. Transistors $T_1$ through $T_n$ can be turned off or turned on by control voltage "$V_{ctrl}$." When transistors $T_1$ through $T_n$ are off, the switch is in the "pass-through" (or "closed") state and allows a mm-wave signal to propagate from the input port (e.g., port P1) to the output port (e.g., port P2) through transmission lines $TL_1$ through $TL_{n-1}$. When transistors $T_1$ through $T_n$ are on, the switch is in the "shunted" (or "open") state and does not allow a mm-wave signal to propagate from the input port (e.g., port P1) to the output port (e.g., port P2) because mm-wave signal is shunted to ground by transistors $T_1$ through $T_n$.

To the best of our knowledge, the behavior of the isolation and insertion loss for the distributed design shown in FIG. 1 has not been analyzed. Using the approach in Lin and with the help of ABCD-parameters, the $S_{21}$ and $S_{12}$ values of the two-port network shown in FIG. 1 can be computed as follows:

$$S_{21} = S_{12} = \frac{2}{2 + Z_o nY}$$

where Zo is the characteristic impedance of the system, n is the number of stages, and Y represents the Y-parameter of each shunt transistor. The isolation loss "ISO" and the insertion loss "IL" of the switch shown in FIG. 1 can be calculated as follows:

$$ISO = |S_{21-on}| = \frac{2}{2 + Z_o n Y_{on}} = \frac{2}{2 + \frac{Z_o n}{R_{on}}} \approx \frac{2R_{on}}{Z_o n}$$

$$IL = |S_{21-off}| = \left|\frac{2}{2 + Z_o n Y_{off}}\right|$$

$$= \frac{2}{\sqrt{\left(2 + \frac{Z_o n}{R_{off}}\right)^2 + Z_o^2 n^2 \omega^2 C_{off}^2}}$$

The isolation equation shows that high isolation can be achieved either by increasing n or by increasing the size of the transistor to reduce $R_{on}$. The approach to increase the transistor size for better isolation can become a problem when the transistor size becomes too large. The reason is that the transistor includes not only an on-resistor $R_{on}$, but also a parasitic capacitance $C_{off}$ in the on-state. The parasitic capacitance eventually degrades the isolation when the device is too large. Therefore, increasing the number of stages n is a more effective approach for achieving high isolation. As shown in the isolation equation above, the isolation varies substantially linearly with n. Therefore, it is preferred to design a multi-stage distributed architecture when high isolation performance is desired, while keep each stage transistor at a relatively small size, which results in a high $R_{off}$ value and a small $C_{off}$. However, the problem with this approach is that the insertion loss from multiple TLs can become an issue, which leads to a tradeoff between high isolation and low insertion loss.

Figure 2A:
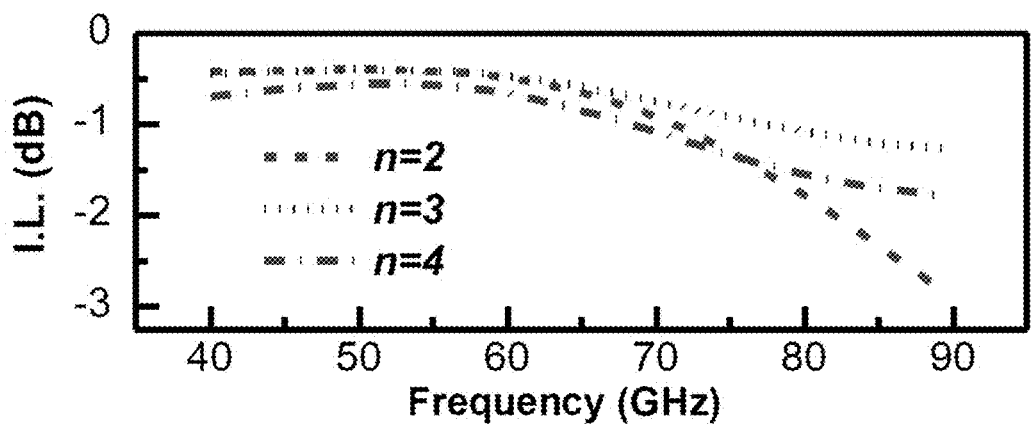
FIGS. 2A and 2B plot simulation results for insertion loss and isolation, respectively, for the switch shown in FIG. 1 when the number of stages is varied, in accordance with some embodiments described herein.
Figure 2B:
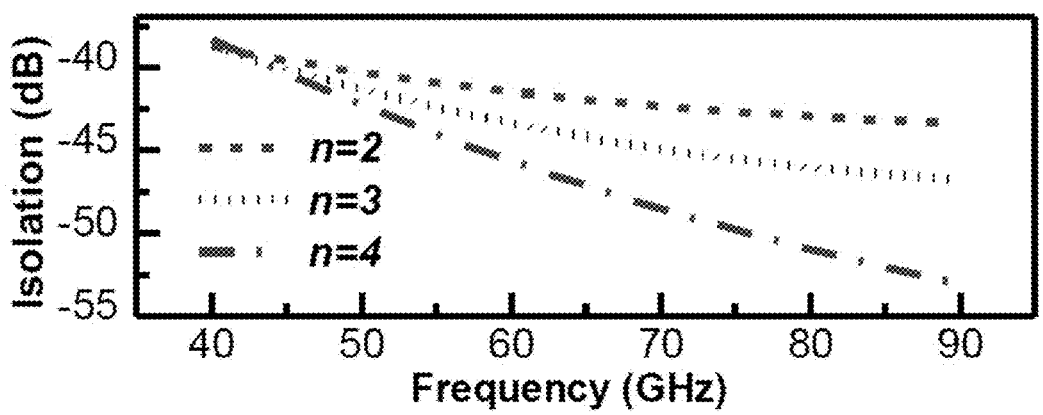

FIGS. 2A and 2B plot simulation results for insertion loss and isolation, respectively, for the distributed switch shown in FIG. 1 when the number of stages is varied, in accordance with some embodiments described herein. For the simulation, a standard transistor model and microstrip TLs were used. The transistor size and TL length were optimized for low insertion loss and high isolation. The pass-band was centered at around 60 GHz. As expected, in FIG. 2B, the isolation continuously increases with the number of stages n. As shown in FIG. 2A, the degradation of insertion loss between a 2-stage and a 3-stage architecture is negligible. In addition, due to the distributed architecture, the 3-stage switch offers a larger bandwidth than its 2-stage counterpart (e.g., as shown in FIG. 2A, there is a significantly larger insertion loss at 90 GHz for the 2-stage design vs. the 3-stage design). However, when n increases to 4, insertion loss suffers from a remarkable degradation, although a higher isolation can be realized. Therefore, in some embodiments described herein, a 3-stage switch structure is adopted. Due to the complex tradeoff between isolation and insertion loss, the optimum number of stages is neither obvious nor predictable. Specifically, it is not obvious that a 3-stage switch would outperform a 4-stage switch for the range of frequencies shown in FIGS. 2A-2B.

Coupling Inductor Based Hybrid Mm-Wave Switch

Circuits that use transmission lines are known as "distributed circuits," e.g., the distributed switch circuit shown in FIG. 1. Distributed circuits require a large amount of area at mm-wave frequencies. Some embodiments described herein feature switch circuits that use lumped elements (instead of transmission lines as shown in FIG. 1), thereby substantially reducing the area required for the switch circuit. Specifically, some embodiments feature a hybrid switch design which combines aspects of a distributed design and a lumped design. Specifically, an embodiment can comprise multiple transistors and lumped inductors in place of the transmission lines.

Figure 3A:
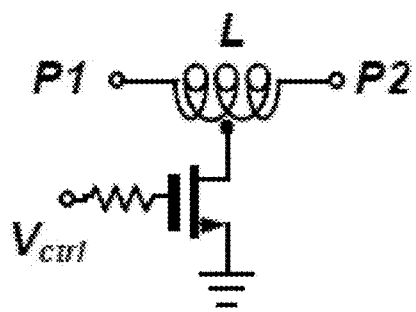
FIG. 3A illustrates a shunt transistor stage in a coupling inductor based hybrid mm-wave switch in accordance with some embodiments described herein.

FIG. 3A illustrates a shunt transistor stage in a coupling inductor based hybrid mm-wave switch in accordance with some embodiments described herein. Unlike a three-stage conventional distributed switch, a coupling inductor "L" is used in the embodiment shown in FIG. 3A, and the second stage shunt transistor shown in FIG. 3A is connected to the center-tap of the coupling inductor. Voltage "$V_{ctrl}$" can be used to "turn on" or "turn off" the transistor. With this configuration, inter-stage coupling is induced by the inductor.

Figure 3B:
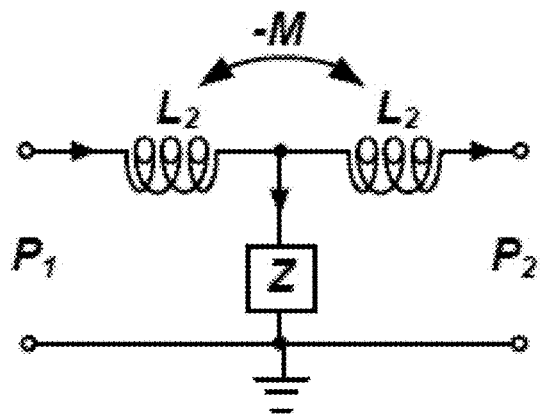
FIG. 3B illustrates an equivalent circuit for the circuit shown in FIG. 3A in accordance with some embodiments described herein.

FIG. 3B illustrates an equivalent circuit for the circuit shown in FIG. 3A in accordance with some embodiments described herein. The coupling inductor "L" in FIG. 3A is modelled by two inductors $L_2$ with mutual inductance M. The "−" sign before the mutual inductance M is due to the negative coupling factor of single turn inductors. The impedance Z is used to model the switch transistor.

Figure 3C:
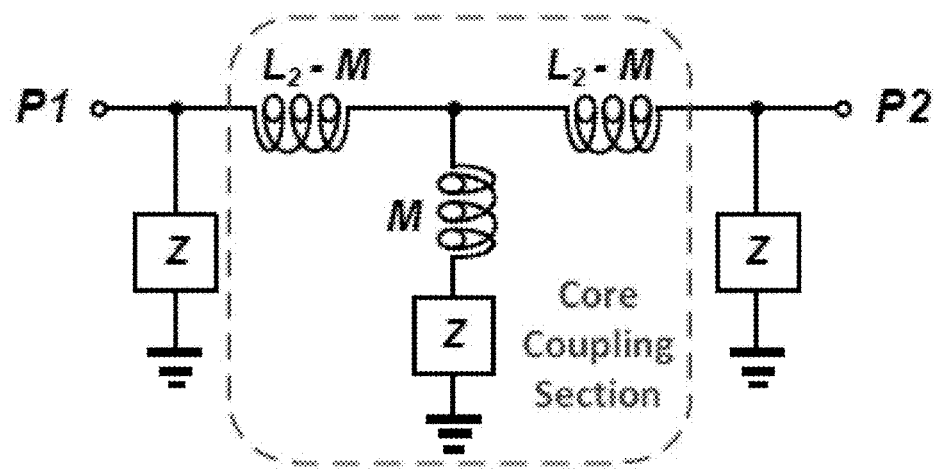
FIG. 3C illustrates an equivalent circuit for a coupling inductor based hybrid mm-wave switch in accordance with some embodiments described herein.

FIG. 3C illustrates an equivalent circuit for a coupling inductor based hybrid mm-wave switch in accordance with some embodiments described herein. Port "P1" can correspond to an input port, port "P2" can correspond to an output port, and each "Z" impedance can correspond to a shunt transistor. In view of FIG. 3C, many implementations of a coupling inductor based hybrid mm-wave switch will be apparent to a person having ordinary skill in the art. Some implementations of such switches are disclosed in the following paragraphs.

The following analysis is for the core coupling section shown by a dashed region in FIG. 3C, which includes the coupled inductor and the second-stage transistor. The ABCD matrix for the core coupling section can be derived as follows:

$$ABCD_m = \begin{pmatrix} \frac{Z + j\omega L_2}{Z + j\omega M} & 2j\omega(L_2 - M) - \frac{\omega^2(L_2 - M)^2}{Z + j\omega M} \\ \frac{1}{Z + j\omega M} & \frac{Z + j\omega L_2}{Z + j\omega M} \end{pmatrix}$$

In this analysis, the parameters with an "M" subscript refer to the results for embodiments that include a coupling inductor (e.g., the switch shown in FIG. 3C). On the other hand, the parameters without an "M" subscript refer to the results of a conventional distributed switch (e.g., the switch shown in FIG. 1). The $S_{21-M}$ can be derived as follows:

$$S_{21-M} = \frac{2(Z + j\omega M)}{\left[2Z + Z_o - \frac{\omega^2}{Z_o}(L_2^2 - M^2)\right] + j\omega\left[2L_2 + \frac{2Z}{Z_o}(L_2 - M)\right]}$$

where Zo refers to the characteristic impedance of the system. As a comparison, a similar section in the conventional distributed switch can also be similarly analyzed. The ABCD matrix of a corresponding section in a convention switch can be derived as follows:

$$ABCD = \begin{pmatrix} \frac{Z + j\omega L_1}{Z} & 2j\omega L_1 - \frac{\omega^2 L_1^2}{Z} \\ \frac{1}{Z} & \frac{Z + j\omega L_1}{Z} \end{pmatrix}$$

and the $S_{21}$ can be derived as follows:

$$S_{21} = \frac{2Z}{\left(2Z + Z_o - \frac{\omega^2 L_1^2}{Z_o}\right) + j\omega\left(2L_1 + \frac{2L_1 Z}{Z_o}\right)}$$

In the above analysis, the same switch transistor size can be used for the conventional structure and also for the new structure described in this disclosure for fair comparison. In the pass-mode, shunt transistors are off, and $Z=1/j\omega C_{off}$. The $R_{off}$ is not included for simplicity and to help provide an insight from the analysis. The last two items of the real part of the denominator in the two $S_{21}$ expressions shown above are removed, since they are much less than the first item. Therefore, the simplified expressions for the two $S_{21}$ values are as follows:

$$S_{21} \approx \frac{2}{(2 - 2\omega^2 L_1 C_{off}) + j\omega \frac{2L_1}{Z_o}}$$

$$S_{21-M} \approx \frac{2(1 - \omega^2 M C_{off})}{(2 - 2\omega^2 L_2 C_{off}) + j\omega \frac{2(L_2 - M)}{Z_o}}$$

Similarly, the insertion loss expressions are:

$$IL = \left|20\log \frac{2}{\sqrt{(2 - 2\omega^2 L_1 C_{off})^2 + (2\omega L_1 / Z_o)^2}}\right|$$

$$IL_M = \left|20\log \frac{2(1 - \omega^2 M C_{off})}{\sqrt{(2 - 2\omega^2 L_2 C_{off})^2 + [2\omega(L_2 - M)/Z_o]^2}}\right|$$

To make a fair comparison, these two circuits (i.e., the conventional switch and the new switch disclosed herein) are set to operate in the same frequency range, which is achieved when $L_2 - M \approx L_1$ Under these conditions, we get:

$(1-\omega^2 M C_{off})*(1-\omega^2 L_1 C_{off}) > (1-\omega^2 L_2 C_{off})$

Meanwhile, $(\omega L_1/Z_o)*(1-\omega^2 M C_{off}) < [\omega(L_2-M)/Z_o]$

Note that $(\omega L_1/Z_o) << (1-\omega^2 L_1 C_{off})$ and $[\omega(L_2-M)/Z_o] << (1-\omega^2 L_2 C_{off})$ Therefore, it can be derived that $IL_M < IL$. In other words, the embodiment shown in FIG. 3C improves the insertion loss when compared to a similar circuit that is designed using the conventional approach shown in FIG. 1.

When transistors are turned on, the switch operates in the isolation-mode. The equivalent impedance of the switch transistor is $R_{on}$. The expressions for isolation can be derived as follows:

$$ISO \approx \left|20\log \frac{2R_{on}}{\sqrt{Z_o^2 + 4L_1^2 \omega^2}}\right|$$

$$ISO_M \approx \left|20\log \frac{2\sqrt{R_{on}^2 + M^2 \omega^2}}{\sqrt{Z_o^2 + 4L_2^2 \omega^2}}\right|$$

Comparing the above two isolation expressions, it can be seen that the mutual inductance M degrades the isolation. At direct current (DC), all the inductors operate as short circuits, and the isolation should be same for both structures (i.e., for the conventional structure shown in FIG. 1 and the new structure shown in FIG. 3C). When the frequency increases, the influence from L and M become obvious. Since $L_2$ is larger than $L_1$, $ISO_M$ is higher than ISO at low frequency. While for higher frequency, effect from M cannot be neglected, resulting in the degradation of the isolation. This phenomenon was confirmed by simulating the conventional circuit design and the new circuit design.

The conclusion from the above analysis can also be intuitively understood from the equivalent circuit shown in FIG. 3C. The mutual inductor M increases the impedance at transistor's drain when it turns off. Thus, insertion loss improves in the pass-mode. In the isolation mode, at low frequency, the mutual inductor M will not affect the drain impedance significantly. However, since the embodiment shown in FIG. 3C has a large inductor (i.e., L2>L1), the signal at input will see a larger impedance, which improves the isolation at low frequency. When frequency increases, the influence from M becomes obvious. It increases the drain impedance of second switch transistor and prevents signal flowing into the ground. So isolation is degraded when frequency increases.

The switch size of 60 μm/60 nm is selected considering the trade-off between the insertion loss and isolation. First, the $R_{on} * C_{off}$ value is checked versus different transistor sizes with the 60 μm transistor offering a smallest value. Second, employing 60 μm/60 nm switch transistor, a conventional 3-stage distributed switch design achieves 1.5 dB insertion loss and 45 dB isolation at around 70 GHz in the simulation. The result provides a good balance between the isolation and insertion loss. For 60 μm/60 nm transistors, the equivalent $R_{off}$, $C_{off}$, and $R_{on}$ are set to be 300 Ω, 30 fF, and 5Ω, respectively.

Next, the coupling inductor based switch design is investigated by choosing optimum mutual conductance M and is compared with the conventional design. The mutual inductance M is swept, meanwhile the inductor $L_2$ value is changed to maintain the operating frequency range. The insertion loss improves with the mutual inductance M. Meanwhile, it is also observed that the response of insertion loss is affected by M significantly. This phenomenon can be explained by investigating the transfer function of the distributed switch. The switch transistor is equivalent to $C_{off}$ in the pass-mode. For the conventional switch design, it can be considered as an N-order filtering structure, which presents a low-pass characteristic. The transfer function in the pass-mode of a single stage is:

$$H(s) = \frac{R_{off}}{s^2 R_{off} C_{off} L_1 + sL_1 + R_{off}}$$

This behaves similarly as a low-pass filter, with the bandwidth determined by the $L_1$ and $C_{off}$. For the embodiment shown in FIG. 3C, the transfer function of the network including $L_2$ and second-stage switch transistor is given by $$H(s) = \frac{s^2 R_{off} C_{off} M + sM + R_{off}}{s^2 R_{off} C_{off} L_2 + sL_2 + R_{off}}$$

Comparing the two transfer function expressions shown above, one can see that two zeros have been added due to the mutual inductance M. By properly choosing M value, the location of the two zeros can be adjusted to achieve a wider frequency response in the pass-mode. As for the isolation performance, simulation results show that the embodiment shown in FIG. 3C has a better isolation than a conventional switch in the lower frequency band, but degrades noticeably when the frequency goes beyond the operating range. This is consistent with the above analysis.

Figure 4:
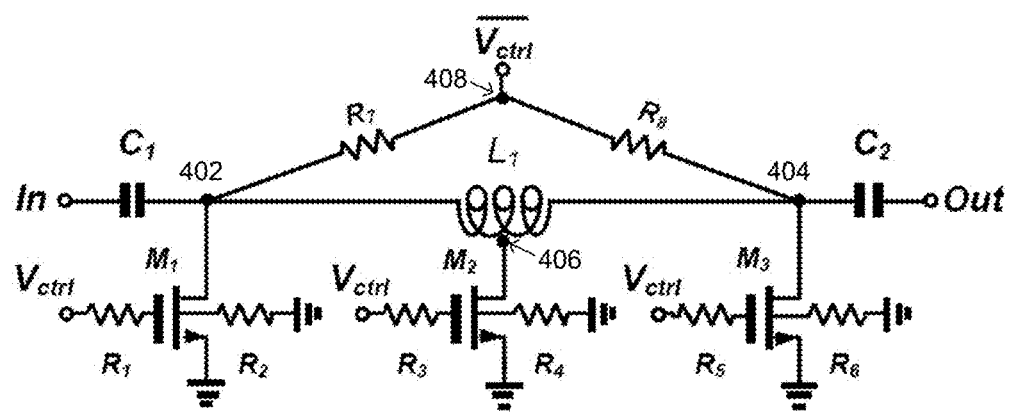
FIG. 4 illustrates a coupling inductor based hybrid mm-wave switch in accordance with some embodiments described herein.

FIG. 4 illustrates a coupling inductor based hybrid mm-wave switch in accordance with some embodiments described herein. In FIG. 4, resistors $R_1$ through $R_6$ can be 10 kΩ, resistors $R_7$ and $R_8$ can be 14 kΩ, capacitances $C_1$ and $C_2$ can be 300 fF, inductance $L_1$ can be 102 pH, and transistors $M_1$ through $M_3$ can have dimensions 4 μm×60 nm×15. Port "In" can be the input port, port "Out" can be the output port, and voltage $V_{ctrl}$ can be the control voltage that is used to toggle the switch operating mode. Capacitances $C_1$ and $C_2$ are DC-block capacitors. The resistance, capacitance, inductance, and transistor parameters described above have been selected for the switch to operate in the E-band. It will be apparent to a person having ordinary skill in the art that a different set of parameter values may be selected if the switch is desired to be operated in a different frequency band.

Some embodiments of a switch can comprise one or more inductors (each inductor can be a lumped inductor) and a plurality of shunt transistors. Specifically, a switch can comprise a first inductor having a first terminal and a second terminal, a second inductor having a first terminal and a second terminal, wherein the second terminal of the first inductor is electrically connected with the first terminal of the second inductor, and wherein a negative mutual inductance exists between the first inductor and the second inductor. In some embodiments, the first inductor can be a portion of a coupling inductor that begins at a first terminal of the coupling inductor and ends at a tap of the coupling inductor, and the second inductor can be a portion of the coupling inductor that begins at the tap of the coupling inductor and ends at a second terminal of the coupling inductor.

The plurality of shunt transistors can comprise (1) a first shunt transistor controlled by a control voltage, wherein the first shunt transistor is electrically connected between the first terminal of the first inductor and a first shunt terminal having a shunt voltage (e.g., the shunt voltage can be ground, but generally the shunt voltage can be any voltage to which the input signal is shunted when the switch is in the "open" state); (2) a second shunt transistor controlled by the control voltage, wherein the second shunt transistor is electrically connected between the second terminal of the first inductor and a second shunt terminal having the shunt voltage; and (3) a third shunt transistor controlled by the control voltage, wherein the third shunt transistor is electrically connected between the second terminal of the second inductor and a third shunt terminal having the shunt voltage.

The embodiment shown in FIG. 4 comprises (1) a coupling inductor $L_1$ having a first terminal 402, a second terminal 404, and a tap 406, (2) a first shunt transistor $M_1$ controlled by a control voltage $V_{ctrl}$, wherein the first shunt transistor $M_1$ is electrically connected between the first terminal 402 of the coupling inductor $L_1$ and a terminal having a shunt voltage (e.g., in FIG. 4, the shunt voltage is shown to be ground, but generally the shunt voltage can be any voltage to which the input signal is to be shunted when the switch is in the "open" state), (3) a second shunt transistor $M_2$ controlled by the control voltage $V_{ctrl}$, wherein the second shunt transistor $M_2$ is electrically connected between the tap 406 of the coupling inductor $L_1$ and a terminal having the shunt voltage; and (4) a third shunt transistor $M_3$ controlled by the control voltage $V_{ctrl}$, wherein the third shunt transistor $M_3$ is electrically connected between the second terminal 404 of the coupling inductor $L_1$ and a terminal having the shunt voltage.

As explained above, a negative mutual inductance can exist between (1) a first portion of the coupling inductor $L_1$ that begins at the first terminal 402 of the coupling inductor $L_1$ and ends at the tap 406 of the coupling inductor $L_1$, and (2) a second portion of the coupling inductor $L_1$ that begins at the tap 406 of the coupling inductor $L_1$ and ends at the second terminal 404 of the coupling inductor $L_1$.

As shown in FIG. 4, the switch can further comprise: (1) an input port "In" to receive an input signal; (2) an output port "Out" to output an output signal; (3) a first capacitor $C_1$ electrically connected between the input port "In" and the first terminal 402 of the coupling inductor $L_1$; and (4) a second capacitor $C_2$ electrically connected between the output port "Out" and the second terminal 404 of the coupling inductor $L_1$.

In some embodiments, the switch can further comprise: (1) a first resistor $R_7$ electrically connected between the first terminal 402 of the coupling inductor $L_1$ and a reverse polarity terminal 408 having a reversed polarity of the control voltage $V_{ctrl}$; and (2) a second resistor $R_8$ electrically connected between the second terminal 404 of the coupling inductor $L_1$ and the reverse polarity terminal 408 having the reversed polarity of the control voltage $V_{ctrl}$.

Figure 5A:
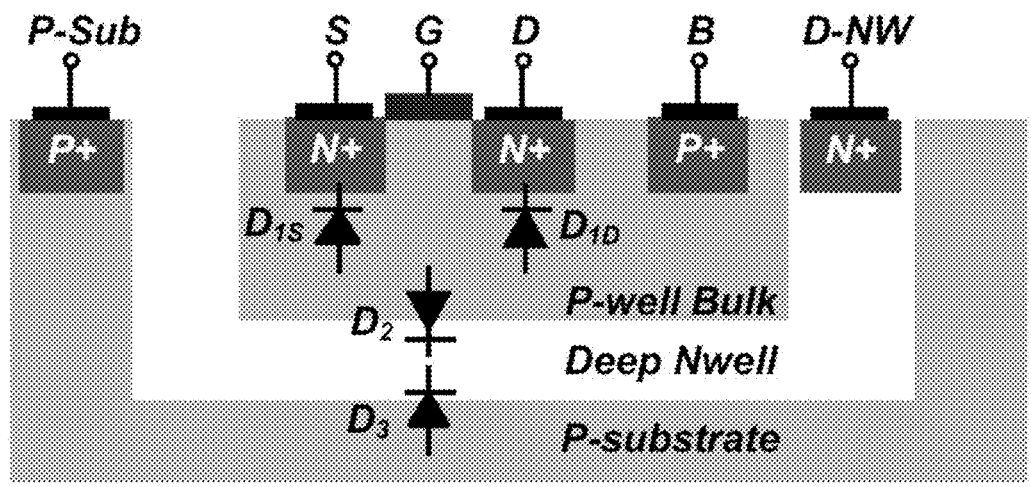
FIG. 5A illustrates a cross-sectional view of a triple-well metal-oxide-semiconductor field-effect-transistor (MOSFET) in accordance with some embodiments described herein.
Figure 5B:
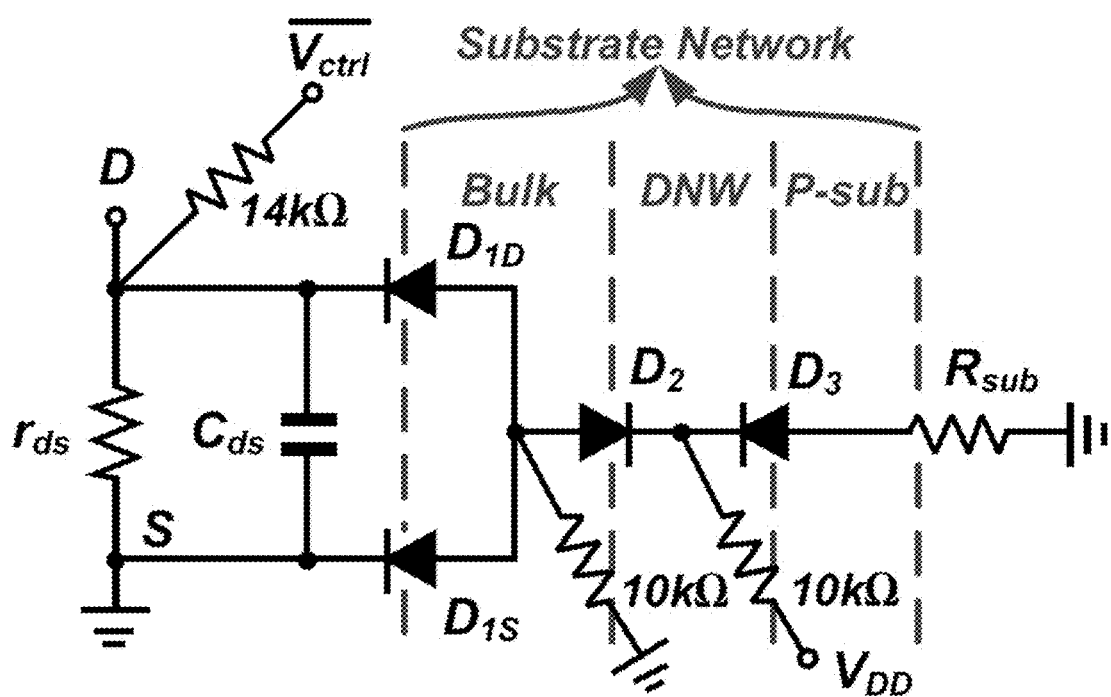
FIG. 5B illustrates an equivalent circuit corresponding to the MOSFET shown in FIG. 5A in accordance with some embodiments described herein.

FIG. 5A illustrates a cross-sectional view of a triple-well MOSFET in accordance with some embodiments described herein. FIG. 5B illustrates an equivalent circuit corresponding to the MOSFET shown in FIG. 5A in accordance with some embodiments described herein.

The triple-well MOSFET shown in FIG. 5A can be fabricated using triple-well CMOS technology, which offers a better performance in terms of isolation and bulk voltage control. Note that the substrate network has three embedded reverse-biased diodes. In this design, two specific biases are applied to the switch transistor as depicted in FIG. 5B. First is the drain bias. The transistor's drain is biased to the reversed polarity of the control voltage. This configuration is different with the regular mm-wave switch design, which usually leaves the drain unbiased. The other one provides the body bias control. The P-well bulk is biased to ground and the deep-Nwell (DNW) is biased to a supply voltage, both through 10 kΩ large resistors.

As shown in FIG. 5B, the bias on the bulk and DNW allow the diodes $D_{1D-S}$, $D_2$ and $D_3$ to be reversely biased, even if the transistor is operating in large-signal mode. This increases the equivalent impedance of the whole substrate network at the drain. The 10 kΩ bias resistors help to isolate the alternating current (AC) signals, which helps improve the power handling capability of the switch. Moreover, a reverse-biased diode behaves as a voltage-controlled capacitor. The capacitance can be expressed as:

$$C_j = \frac{C_0}{\sqrt{1 - \frac{V_b}{\phi}}}$$

where $C_0$ is the capacitance with zero reverse bias, $V_b$ is the reversed bias voltage and $\phi$ is the contact potential of the pn-junction. Therefore, applied body bias also reduces parasitic capacitance of the substrate network.

Another special bias scheme is to bias the transistor's drain to the reversed polarity of the control voltage, as shown in FIG. 5B. When the transistor turns off, the drain is biased at VDD. The equivalent output impedance of the turn-off transistor is defined as:

$$r_{ds} = \frac{\partial V_{DS}}{\partial I_{DS}}$$

In weak inversion region, the expression of the drain current is $$I_D = I_0 \exp\left(\frac{V_{GS} - V_{th}}{nV_T}\right)\left[1 - \exp\left(-\frac{V_{DS}}{V_T}\right)\right]$$

When VGS equals to zero, the expression of $r_{ds}$ is derived as $$r_{ds} = \frac{V_T}{I_0} \exp\left(\frac{V_{DS}}{V_T} + \frac{V_{th}}{nV_t}\right)$$

The $r_{ds}$ increases dramatically with a large $V_{ds}$. The increase of $r_{ds}$ results in an improvement of equivalent impedance $R_{off}$. Equivalent $C_{off}$ and $R_{off}$ for different transistor size under different bias schemes were extracted. The results showed that $C_{off}$ does not change much. However, $R_{off}$ experienced a significant increase with the bulk floating and drain bias. For instance, the equivalent $R_{off}$ of the 60 µm transistor increases from 290Ω to 960Ω by applying bulk floating, and then increases further to 1.5 kΩ with the reverse drain bias technique together. These improvements ultimately lead to lower insertion loss. Approximate 0.5 dB improvement was observed in the simulation by applying this bias scheme.

The influence of the coupling effect on insertion loss and isolation is now analyzed. The coupling coefficient is used here for the optimization to give a normalized view point, which is defined as:

$$k = \frac{M}{\sqrt{L_2 \cdot L_2}} = \frac{M}{L_2}$$

The inductors are modelled with a first order π model with a series resistor and the parasitic parallel capacitors. The design target is to achieve isolation higher than 35 dB with acceptable insertion loss in the E-band. However, due to parasitic capacitance, the increased inductance only benefits the isolation in the low frequency band. The coupling effect degrades the isolation in the high frequency range. Considering a compromise between isolation and insertion loss, the preferred k was found to be around −0.26.

Figure 6A:
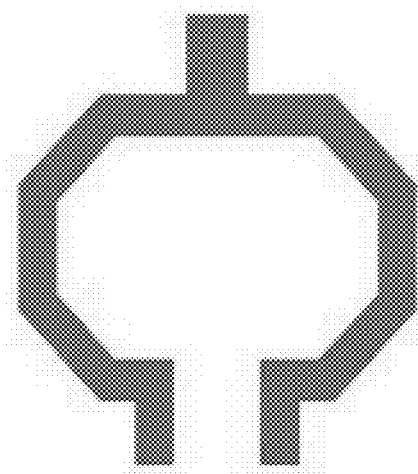
FIG. 6A illustrates a regular octagon shaped inductor design in accordance with some embodiments described herein.
Figure 6B:
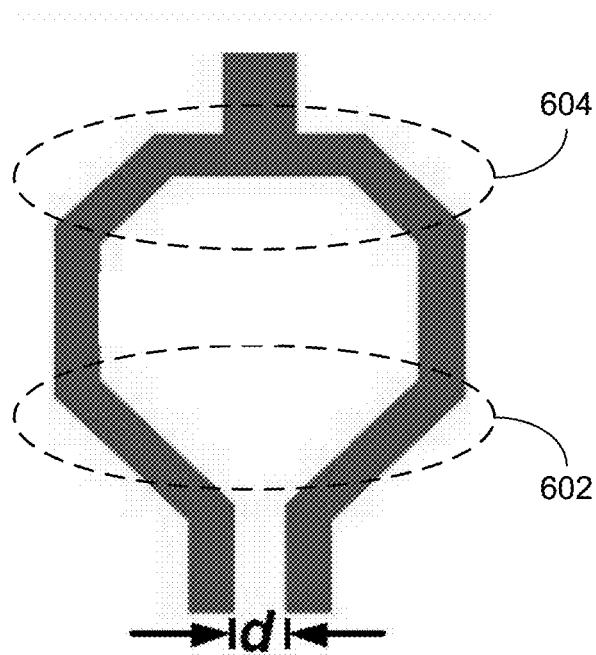
FIG. 6B illustrates an irregular octagon shaped inductor design in accordance with some embodiments described herein.

It is important to appropriately design the coupling inductor. In the E-band, it is not difficult to realize an inductor with quality factor higher than 20. So, the concern during inductor design is not the quality factor, but the inductance and the coupling coefficient. FIG. 6A illustrates a regular octagon shaped inductor in accordance with some embodiments described herein. In some embodiments, in order to vary the coupling coefficient and inductance, the coupled inductor design does not use a regular octagon shape as shown in FIG. 6A. FIG. 6B illustrates an irregular octagon shaped inductor design in accordance with some embodiments described herein. Instead of using the regular octagon shape shown in FIG. 6A, some embodiments described herein use an inductor in which the lower part 602 has a different size from the upper part 604, meanwhile the distance "d" between the two terminals can be adjusted, as shown in FIG. 6B. These changes of inductor's shape both affect the coupling coefficient and inductance value. The ultimate inductor optimization is verified by electromagnetic simulation. In one embodiment, the designed inductor results in 102 pH inductance with approximately a −0.28 coupling coefficient.

One implementation of the switch was fabricated using a standard bulk 65 nm CMOS technology with a 6-metal back-end. The switch core circuit occupied only 100×120 µm² area. The resulting switch had the following parameters (which are better than other existing approaches): (1) operating bandwidth was 54-84 GHz, (2) minimum insertion loss was 1.7 dB, (3) return loss was less than 10 dB, (4) isolation was greater than 35 dB, (5) input-referred P1 dB compression-point in the pass-mode was 10.5 dBm, (6) core area was 0.012 mm², and (7) the switch was fabricated in a 65 mm CMOS process.

The foregoing description has been presented to enable any person skilled in the art to make and use the embodiments. The described embodiments are not intended to be exhaustive or to limit the present invention. Various modifications to the disclosed embodiments will be readily apparent to those skilled in the art, and the general principles defined herein are applicable to other embodiments and applications without departing from the spirit and scope of the present disclosure. Thus, the present invention is to be accorded the widest scope consistent with the principles and features disclosed herein. The scope of the present invention is defined by the appended claims.

What is claimed is:

1. A switch, comprising:
   a plurality of inductors, comprising a first inductor having a first terminal and a second terminal, a second inductor having a first terminal and a second terminal, wherein the second terminal of the first inductor is electrically connected with the first terminal of the second inductor, and wherein a negative mutual inductance exists between the first inductor and the second inductor; and
   a plurality of shunt transistors, comprising:
      a first shunt transistor controlled by a control voltage, wherein the first shunt transistor is electrically connected between the first terminal of the first inductor and a first shunt terminal having a shunt voltage;
      a second shunt transistor controlled by the control voltage, wherein the second shunt transistor is electrically connected between the second terminal of the first inductor and a second shunt terminal having the shunt voltage; and
      a third shunt transistor controlled by the control voltage, wherein the third shunt transistor is electrically connected between the second terminal of the second inductor and a third shunt terminal having the shunt voltage.

2. The switch of claim 1, wherein the shunt voltage is ground.

3. The switch of claim 1, wherein the first inductor is a portion of a coupling inductor that begins at a first terminal of the coupling inductor and ends at a tap of the coupling inductor, and wherein the second inductor is a portion of the coupling inductor that begins at the tap of the coupling inductor and ends at a second terminal of the coupling inductor.

4. The switch of claim 3, wherein the coupling inductor has an irregular octagonal shape.

5. The switch of claim 1, further comprising:
an input port to receive an input signal;
an output port to output an output signal;
a first capacitor electrically connected between the input port and the first terminal of the first inductor; and
a second capacitor electrically connected between the output port and the second terminal of the second inductor.

6. The switch of claim 1, further comprising:
a first resistor electrically connected between the first terminal of the first inductor and a reverse polarity terminal having a reversed polarity of the control voltage; and
a second resistor electrically connected between the second terminal of the second inductor and the reverse polarity terminal having the reversed polarity of the control voltage.

7. The switch of claim 1, wherein each shunt transistor has a triple-well structure comprising a P-well bulk, a deep-Nwell, and a P-substrate, wherein the P-well bulk is biased to ground, and the deep-Nwell is biased to a supply voltage.

8. A device, comprising:
a first circuit to generate a millimeter (mm)-wave signal;
a second circuit to receive the mm-wave signal; and
a switch electrically connected between the first circuit and the second circuit, the switch comprising:
a plurality of inductors, comprising a first inductor having a first terminal and a second terminal, a second inductor having a first terminal and a second terminal, wherein the second terminal of the first inductor is electrically connected with the first terminal of the second inductor, and wherein a negative mutual inductance exists between the first inductor and the second inductor; and
a plurality of shunt transistors, comprising:
a first shunt transistor controlled by a control voltage, wherein the first shunt transistor is electrically connected between the first terminal of the first inductor and a first shunt terminal having a shunt voltage;
a second shunt transistor controlled by the control voltage, wherein the second shunt transistor is electrically connected between the second terminal of the first inductor and a second shunt terminal having the shunt voltage; and
a third shunt transistor controlled by the control voltage, wherein the third shunt transistor is electrically connected between the second terminal of the second inductor and a third shunt terminal having the shunt voltage.

9. The device of claim 8, wherein the shunt voltage is ground.

10. The device of claim 8, wherein the first inductor is a portion of a coupling inductor that begins at a first terminal of the coupling inductor and ends at a tap of the coupling inductor, and wherein the second inductor is a portion of the coupling inductor that begins at the tap of the coupling inductor and ends at a second terminal of the coupling inductor.

11. The device of claim 10, wherein the coupling inductor has an irregular octagonal shape.

12. The device of claim 8, wherein the switch further comprises:
an input port to receive the mm-wave signal;
an output port to output the mm-wave signal;
a first capacitor electrically connected between the input port and the first terminal of the first inductor; and
a second capacitor electrically connected between the output port and the second terminal of the second inductor.

13. The device of claim 8, wherein the switch further comprises:
a first resistor electrically connected between the first terminal of the first inductor and a reverse polarity terminal having a reversed polarity of the control voltage; and
a second resistor electrically connected between the second terminal of the second inductor and the reverse polarity terminal having the reversed polarity of the control voltage.

14. The device of claim 8, wherein each shunt transistor has a triple-well structure comprising a P-well bulk, a deep-Nwell, and a P-substrate, wherein the P-well bulk is biased to ground, and the deep-Nwell is biased to a supply voltage.

15. A circuit, comprising:
a plurality of switches, wherein each switch comprises:
a coupling inductor having a first terminal, a second terminal, and a tap;
a first shunt transistor controlled by a control voltage, wherein the first shunt transistor is electrically connected between the first terminal of the coupling inductor and a first shunt terminal having a shunt voltage;
a second shunt transistor controlled by the control voltage, wherein the second shunt transistor is electrically connected between the tap of the coupling inductor and a second shunt terminal having the shunt voltage; and
a third shunt transistor controlled by the control voltage, wherein the third shunt transistor is electrically connected between the second terminal of the coupling inductor and a third shunt terminal having the shunt voltage.

16. The circuit of claim 15, wherein the shunt voltage is ground.

17. The circuit of claim 15, wherein a negative mutual inductance exists between (1) a first portion of the coupling inductor that begins at the first terminal of the coupling inductor and ends at the tap of the coupling inductor, and (2) a second portion of the coupling inductor that begins at the tap of the coupling inductor and ends at the second terminal of the coupling inductor.

18. The circuit of claim 15, wherein each switch further comprises:
a first resistor electrically connected between the first terminal of the coupling inductor and a reverse polarity terminal having a reversed polarity of the control voltage; and a second resistor electrically connected between the second terminal of the coupling inductor and the reverse polarity terminal having the reversed polarity of the control voltage.

19. The circuit of claim 15, wherein each shunt transistor has a triple-well structure comprising a P-well bulk, a deep-Nwell, and a P-substrate, wherein the P-well bulk is biased to ground, and the deep-Nwell is biased to a supply voltage.

20. The circuit of claim 15, wherein the coupling inductor has an irregular octagonal shape.

\* \* \* \* \*